US006438039B1

(12) United States Patent
Liu et al.

(10) Patent No.: US 6,438,039 B1
(45) Date of Patent: Aug. 20, 2002

(54) ERASING DEVICE AND METHOD FOR FLASH MEMORY

(75) Inventors: Tseng-Yi Liu, Taipei-Hsien; Han-Sung Chen; Chun-Hsiung Hung, both of Hsinchu, all of (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/898,789

(22) Filed: Jul. 3, 2001

(51) Int. Cl.[7] ................................................ G11C 11/34
(52) U.S. Cl. .............................. 365/185.33; 365/185.11
(58) Field of Search ....................... 365/185.33, 230.03, 365/185.11

(56) References Cited

U.S. PATENT DOCUMENTS 3,833,892 A * 9/1974 Marsalka et al. ........ 340/172.5
4,864,565 A * 9/1989 Schuster et al. ............ 370/105

FOREIGN PATENT DOCUMENTS

JP 3-14272 A * 1/1991 ......... H01L/29/788

OTHER PUBLICATIONS

Betty Prince, "Semiconductor Memories", 1983, Wiley, 2nd edition, pp. 590–592.*

* cited by examiner

*Primary Examiner*—M. Tran
(74) *Attorney, Agent, or Firm*—J.C. Patents

(57) ABSTRACT

An erase device and a method of erasing data from a flash memory. The erase device includes a shift control signal transmission terminal, an erase control group and a pulse control group. The shift control signal transmission terminal is used for transmitting a shift control signal. The erase control group includes a plurality of serially connected erase controllers. Each erase controller corresponds to a memory block. Each of the erase controllers contains a shift register, a receiving terminal and an output terminal. The receiving terminal of the first erase controller receives a shift control signal sent from the shift control signal transmission terminal. The receiver terminal of a subsequent erase controller connects electrically with the output terminal of the previous erase controller. In addition, the shift register contains a shift control signal received from the receiving terminal. The shift control signal is used for directing the erasure of memory block data that correspond to the erase controller. The pulse control signal group controls the sending and the receiving of shift control signals.

12 Claims, 3 Drawing Sheets

10
24
12
14
21
22
26
28
20
Shift Register
Latching Register
Memory Block 0
27
44
40
41
42
46
48
Shift Register
Latching Register
Memory Block 1
47
64
60
61
62
66
68
Shift Register
Latching Register
Memory Block 127
67

ERASING DEVICE AND METHOD FOR FLASH MEMORY

CROSS-REFERENCE TO RELATED APPLICATION

This application claims the priority benefit of Taiwan application serial no. 90106035, filed Mar. 15, 2001.

BACKGROUND OF THE INVENTION

1. Field of Invention

The present invention relates to a type of flash memory. More particularly, the present invention relates to a flash memory having an erasing device for erasing all data within a plurality of memory blocks at the same time.

2. Description of Related Art

In U.S. Pat. No. 5,978,275 with the title "Erase and Program Control State Machines for Flash Memory", an erase state machine is used to control the erasure of data within specified memory blocks. Thereafter, the memory blocks are checked to ascertain the complete erasure of data from memory.

Although the conventional technique can delete the data within specified memory blocks of a flash memory on command, a large number of complicated electronic circuit devices is employed, leading to a complex routing circuit and a big increase in production cost.

SUMMARY OF THE INVENTION

Accordingly, one object of the present invention is to provide an erase device for a flash memory that not only can simplify circuit layout and reduce production cost, but can also simultaneously erase a variable number of memory blocks.

To achieve these and other advantages and in accordance with the purpose of the invention, as embodied and broadly described herein, the invention provides an erase device and a method of erasing data from a flash memory. The erase device includes a shift control signal transmission terminal, an erase control group and a pulse control group. The shift control signal transmission terminal is used for transmitting a shift control signal. The erase control group includes a plurality of serially connected erase controllers. Each erase controller corresponds to a memory block. Each of the erase controllers contains a shift register, a receiving terminal and an output terminal. The receiving terminal of the first erase controller receives a shift control signal sent from the shift control signal transmission terminal. The receiving terminal of a subsequent erase controller connects electrically with the output terminal of the previous erase controller. In addition, the shift register contains a shift control signal received from the receiving terminal. The shift control signal is used for directing the erasure of memory block data that correspond to the erase controller. The pulse control signal group controls the sending and the receiving of shift control signals.

This invention also provides a method of erasing flash memory data related to the erasing operation. The flash memory includes a plurality of memory blocks with each memory block having a corresponding erase controller.

The method of erasing flash memory includes the following steps. First, the memory blocks from which data needs to be erased are set. These memory blocks are set by transmitting an erase signal to a latching register within the corresponding erase controllers. Thereafter, a preset number of pulses related to the pulse control signal are produced. According to the pulse control signal, shift control signals are sequentially transferred to the serially connected erase controller. Finally, according to the shift control signal and the erase signal, the erase controller erases the content within the memory blocks.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
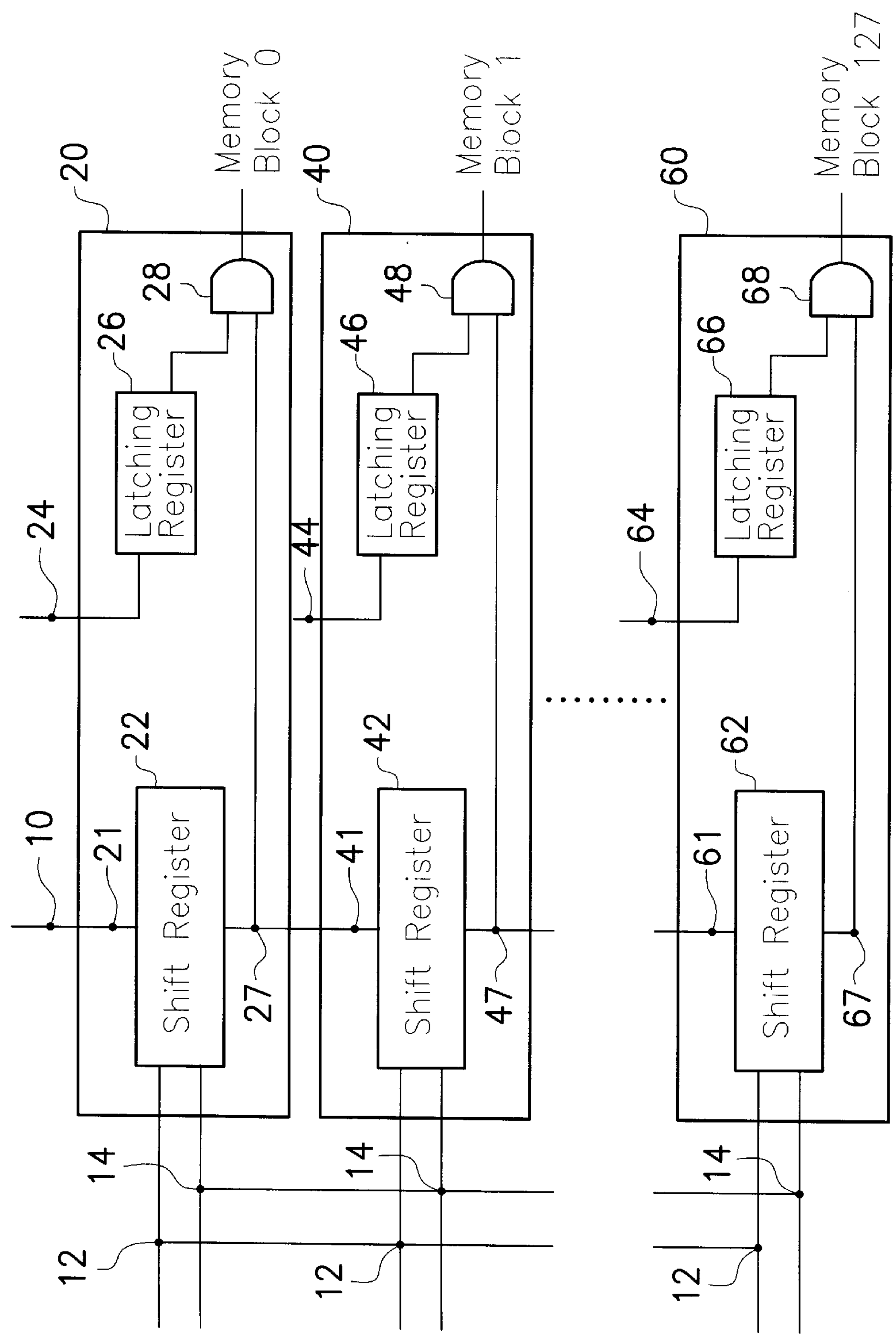
FIG. 1 is a circuit diagram of an erase device of a flash memory according to this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a circuit diagram of an erase device of a flash memory according to this invention. In general, a flash memory contains a plurality of memory blocks such as memory block 0 to memory block 127, for a total of 128 memory blocks. Furthermore, each memory block has a corresponding erase controller capable of erasing data within the block when triggered.

The flash memory erase device includes a shift control signal transmission terminal 10 and serially connected erase controllers such as the erase controllers 20, 40 and 60 in FIG. 1. Note that the erase controllers 20, 40 and 60 are just examples of the 128 erase controllers. Each erase controller further includes a shift register, a receiving terminal and an output terminal.

The shift control signal transmission terminal 10 transmits a shift control signal to the erase controller 20. The shift control signal has a typical value of '1'. When the receiving terminal 21 of the erase controller 20 receives the shift control signal, the shift control signal is stored inside a shift register 22. The receiving terminals of subsequent erase controllers 40 and 60 are each electrically coupled to the output terminal of a respective previous erase controller. For example, the receiving terminal 41 of the erase controller 40 is electrically coupled to the output terminal 27 of the erase controller 20 for receiving a shift control signal from the output terminal 27 of the erase controller 20. After receiving a shift control signal, the shift control signal is stored inside the shift register of the erase controller. The shift control signal is principally used for erasing the content within a memory block linked to the erase controller.

A pulse control signal group includes a master pulse control signal and a slave control signal. The pulse control signal group controls the receiving and sending of a shift control signal. The master pulse control signal is transmitted from a master pulse control signal transmission terminal 12 to an erase controller so that the receiving of shift control signal by the receiving terminal of the erase controller is under control. The slave pulse control signal is transmitted from a slave pulse control signal transmission terminal 14 to the erase controller so that the sending of the shift control signal by the output terminal of the erase controller is under control.

In addition, each erase controller further includes a latching register (26, 46 or 66 as shown in FIG. 1), an erase signal transmission terminal (24, 44 or 64 as shown in FIG. 1) and an AND gate (28, 48 or 68 as shown in FIG. 1). The latching register temporarily stores the erase signal sent from the erase signal transmission terminal. The erase signal corresponds to the memory block whose content needs to be erased. For example, if the contents within the memory blocks 0 and 1 need to be erased, the latching register 26 within the erase controller 20 and the latching register 46 within the erase controller 40 will receive an erase signal from the erase signal transmission terminal 24 and the erase signal transmission terminal 44, respectively. The erase signal has a typical value of '1'.

In the aforementioned example, when both erase controllers 20 and 40 receive an erase signal and both shift registers 22 and 42 also receive a shift control signal, the AND gates 28 and 48, upon receiving output signals from an erase controller and a shift register, will conduct a logical operation of the erase signal and the shift control signal to produce an erase enable signal. Each erase enable signal triggers an erase circuit so that the data within the memory blocks 0 and 1, having connection with the erase controllers 20 and 40 respectively, are erased.

Figure 2A:
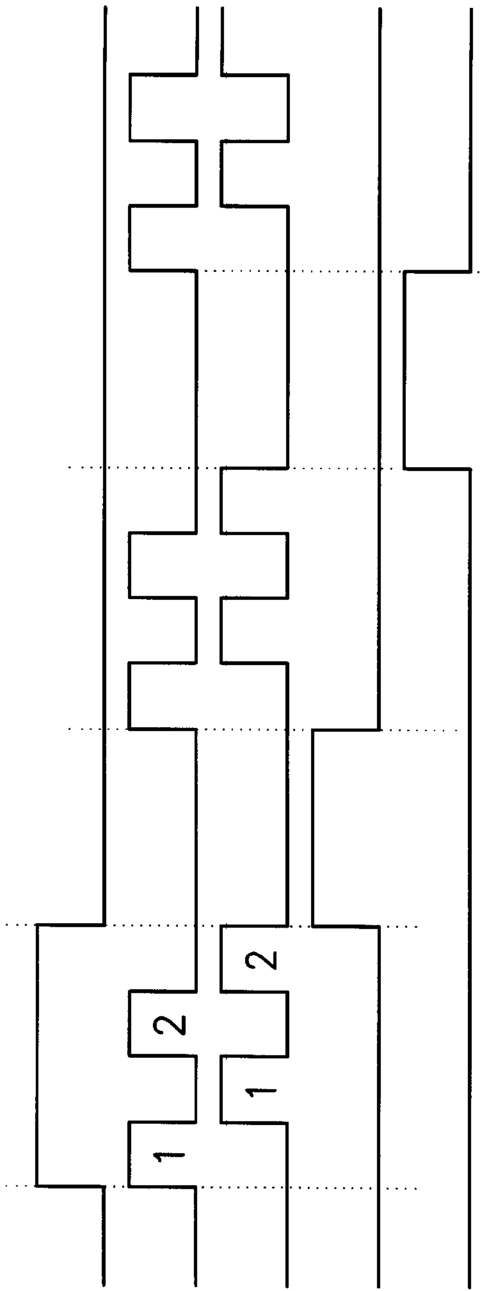
FIGS. 2A and 2B are timing diagrams showing the signals used by the flash memory device of this invention.
Figure 2B:
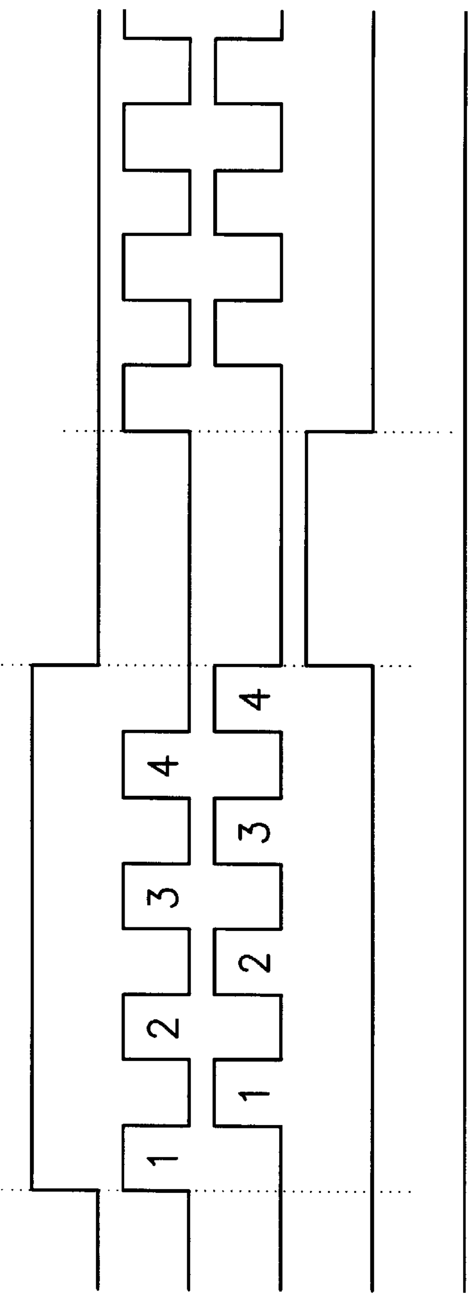

FIGS. 2A and 2B are timing diagrams showing the signals used by the flash memory device of this invention. In FIG. 2A, SHIFTIN is the shift control signal waveform, CKM is the master pulse control signal waveform and CKS is the slave pulse control signal waveform. As shown in FIG. 2A, a CKS pulse is generated after each CKM pulse. Hence, a pair of CKS pulses is produced for every pair of CKM pulses. Here, two cycles form a shifting unit. In other words, after the completion of a pulse control cycle, the particular erase controller for action is determined. However, in this invention, aside from the erasing action, the number of pulses in the control signal group can be preset to control the number of memory blocks to be erased simultaneously. Furthermore, the preset number of pulses in the pulse control group varies according to the pulse width of the shift control signal. As shown in FIG. 2, when SHIFTIN has a pulse width of two cycles, the number of preset pulses in the pulse control group has a cycle width of two. Therefore, after two cycles, there is an erasing period ERASING (SEC0, 1) in FIG. 2A for erasing the data in memory blocks 0 and 1. In addition, the preset number of pulses in the pulse control group varies according to the pulse width of the shift control signal. Consequently, if SHIFTIN has a pulse width of four cycles, the number of preset pulses in the pulse control group has a width of four cycles. After four pulse cycles, there is an erasing period ERASING (SEC0, 1,2,3) in FIG. 2B for erasing the data in memory blocks 0, 1, 2 and 3.

Figure 3:
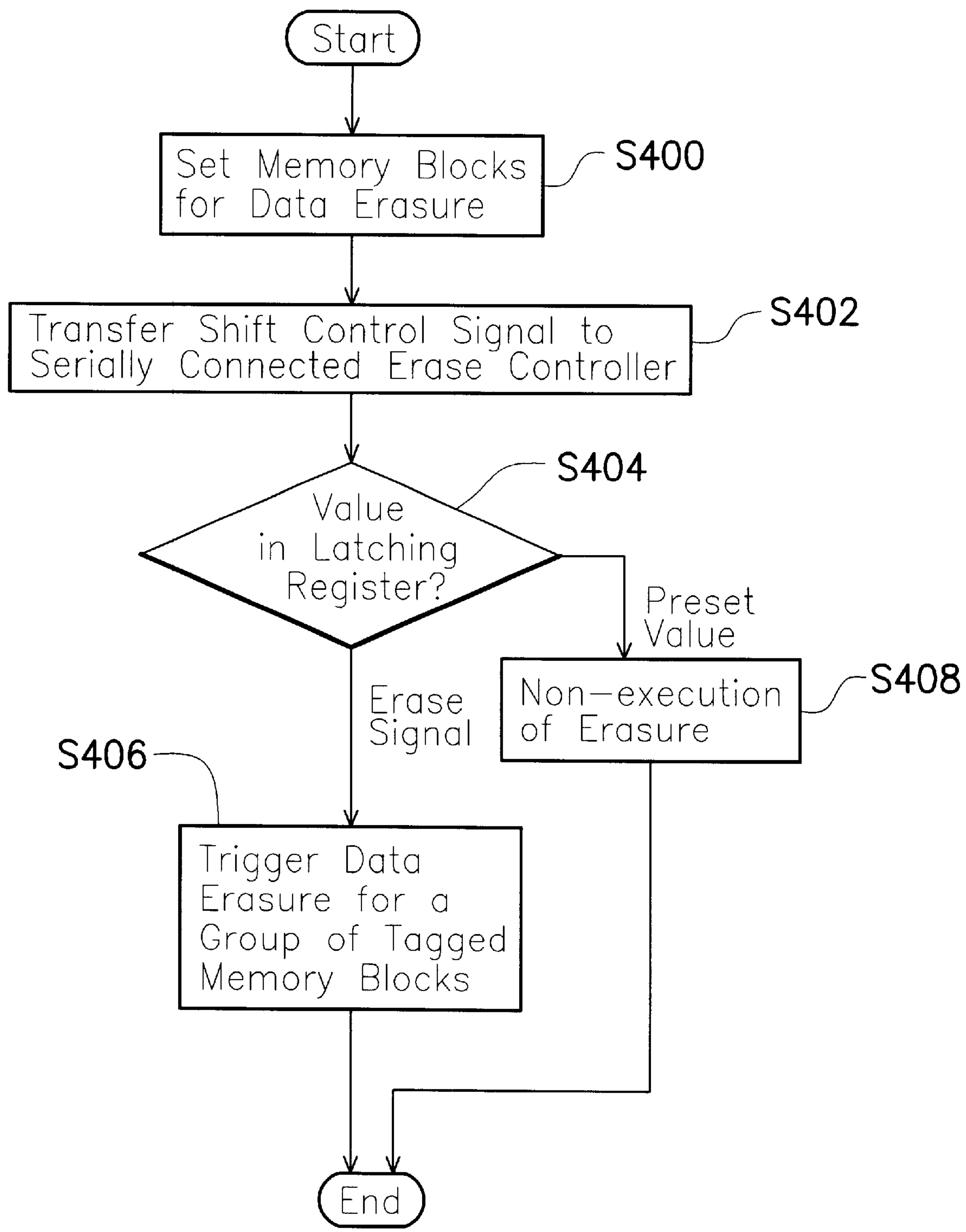
FIG. 3 is a flow chart showing the steps for operating the flash memory erase device according to this invention.

FIG. 3 is a flow chart showing the steps for operating the flash memory erase device according to this invention. The method is related to the operation of erasing data from a flash memory. The flash memory includes a plurality of memory blocks with each memory block having a corresponding erase controller. Furthermore, the erase controllers are serially connected together.

The flash memory erasing method involves several steps. In step s400, the particular memory blocks whose data needs to be erased is determined. Erase signals are transmitted to the respective latching registers of the particular erase controllers linked to the memory blocks. Thereafter, a preset number of pulses related to the pulse control signal is generated. In step s402, the pulse control signal controls the placement of shift control signals into various serially connected erase controllers sequentially. Here, the number of preset pulses in the pulse control signal varies according to the width of the shift control signal. If the pulse width of the shift control signal is two cycles, the number of preset pulses in the pulse control signal is two cycles. On the other hand, if the pulse width of the shift control signal is four cycles, the number of preset pulses in the pulse control signal is four cycles.

In step s404, the value stored inside the latching register of the erase controller is checked. If a value of '1' is in the latching register, an erasing operation is executed according to the shift control signal and the erase signal by triggering the erase controllers to erase the data within preset memory blocks simultaneously in an erasing period in step s406. The number of memory blocks to be erased simultaneously is based on the number of preset pulses in the pulse control signal. If the number of preset pulses is two cycles, the number of memory blocks erased concurrently is two. In addition, the number of preset pulses in the pulse control signal is determined by the pulse width of the shift control signal. Following similar arguments, the number of memory blocks that can be concurrently erased increases with the pulse width of the shift control signal. On the other hand, a value of '0' inside the latching register in step s404 indicates that data within the particular blocks need not be eliminated. Hence, the erase controller of the memory block is not triggered.

In conclusion, the advantages of this invention include:

1. A simpler circuit design that reduces circuit routing area and production cost.
2. A plurality of memory blocks that can be erased in a single operation.
3. The number of memory blocks to be erased can be set by varying the pulse width of shift control signal. Hence, the number of memory blocks to be erased concurrently can be easily modified.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An erase device for erasing data from a flash memory, comprising:

a shift control signal transmission terminal for transmitting a shift control signal; and an erase controller group having a plurality of serially connected erase controllers, wherein each erase controller corresponds to a memory block, each erase controller includes a shift register, a receiving terminal and an output terminal such that the receiving terminal of a first erase controller receives the shift control signal from the shift control signal transmission terminal under control of a pulse control signal group and each receiving terminal of each subsequent erase controller connects with an output terminal of a respective previous erase controller, and wherein the shift register stores up a shift control signal received from the receiving terminal, the shift control signal received from the receiving terminal serving to control erasure of data in a memory block corresponding to the erase controller.

2. The erase device of claim 1, wherein the pulse control signal group includes a master pulse control signal and a slave pulse control signal.

3. The erase device of claim 2, wherein the master pulse control signal controls the receiving terminal of the erase controller to receive a shift control signal.

4. The erase device of claim 2, wherein the slave pulse control signal controls the output terminal of the erase controller to issue a shift control signal.

5. The erase device of claim 1, wherein the erase controller further includes:

a latching register for holding an erase signal;

an erase signal transmission terminal coupled to the latching register for transmitting the erase signal to the latching register; and an AND logic gate coupled to the latching register and the output terminal for receiving both the erase signal from the latching register and the shift control signal from the output terminal and executing a logic computation to produce an erase enable signal, and the erase enable signal triggers an erase controller to initiate erasure of data from a corresponding memory block.

6. The erase device of claim 1, wherein a preset number of pulses of the pulse control signal group is used to determine a number of memory blocks to be erased in a single erasing period.

7. The erase device of claim 6, wherein the preset number of pulses in the pulse control signal group varies according to a pulse width of the shift control signal.

8. A method of erasing data from a flash memory having a plurality of memory blocks with each memory block linked to an erase controller and the erase controllers connected serially together, the method:

setting the memory blocks from which data is to be erased and sending erase signals to respective latching registers inside the erase controllers that correspond to the memory blocks;

generating a pulse control signal having a preset number of pulses;

sequentially delivering a shift control signal to the serially connected erase controller according to a controlling action of the pulse control signal; and triggering the erase controllers of corresponding memory blocks to initiate data erasure according to the shift control signal and the erase signal.

9. The method of claim 8, wherein the latching register inside an erase controller that corresponds to a particular memory block has a preset value if no erasure of the data within the particular memory block is required.

10. The method of claim 9, wherein an erasure of the data within a particular memory block is conducted if the latching register inside the erase controller that corresponds to the memory block contains a value other than the preset value.

11. The method of claim 8, further including erasing the data within the memory blocks within an erasing period after generating the pulse control signal with a requisite number of preset pulses.

12. The method of claim 11, wherein the number of preset pulses varies according to a pulse width of the shift control signal.

* * * * *